(12) United States Patent
Hull et al.

(10) Patent No.: US 8,288,220 B2
(45) Date of Patent: Oct. 16, 2012

(54) METHODS OF FORMING SEMICONDUCTOR DEVICES INCLUDING EPITAXIAL LAYERS AND RELATED STRUCTURES

(75) Inventors: Brett Adam Hull, Raleigh, NC (US); Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 352 days.

(21) Appl. No.: 12/412,448

(22) Filed: Mar. 27, 2009

(65) Prior Publication Data

US 2010/0244047 A1 Sep. 30, 2010

(51) Int. Cl.
*H01L 21/8238* (2006.01)

(52) U.S. Cl. ........ 438/212; 438/197; 438/199; 438/209; 438/268; 257/288; 257/327; 257/329; 257/335; 257/E29.256; 257/E29.261; 257/E29.262; 257/E21.41; 257/E21.417; 257/E21.418

(58) Field of Classification Search .................. 257/106, 257/146, 171, 334, 339, 341, 355, 356, 360, 257/544, 551, 328, 494, E21.05, E21.051, 257/E29.201, E29.257, E27.016, 288, 327, 257/329, 335, E29.256, E29.261, E29.262, 257/E21.41, E21.417, E21.418; 438/237, 438/983, 197, 199, 209, 212, 268, 235
See application file for complete search history.

(56) References Cited

U.S. PATENT DOCUMENTS

| | | | |
|---|---|---|---|
| 3,629,011 A | 12/1971 | Tohi et al. | |
| 3,924,024 A | 12/1975 | Naber et al. | |
| 4,466,172 A | 8/1984 | Batra | |
| 4,811,065 A | 3/1989 | Cogan | |
| 4,875,083 A | 10/1989 | Palmour | |
| 5,111,253 A | 5/1992 | Korman et al. | |
| 5,170,231 A | 12/1992 | Fujii et al. | |

(Continued)

FOREIGN PATENT DOCUMENTS

DE 198 09 554 9/1998

(Continued)

OTHER PUBLICATIONS

Straddle-Gate transistor: changing MOSFET channel length between off- and on-state towards achieving tunneling-defined limit of field-effect. Tiwari, S.; Weiser, J.J.; Solomon, P.M.; Electron Devices Meeting, 1998. IEDM '98 Technical Digest., International Digital Object Identifier: 10.1109/IEDM.1998.746462 Pub. Year: 1998 , pp. 737-740.*

(Continued)

*Primary Examiner* — A. Sefer
*Assistant Examiner* — Farid Khan
(74) *Attorney, Agent, or Firm* — Myers Bigel Sibley & Sajovec, P.A.

(57) ABSTRACT

A method of forming a semiconductor device may include forming a terminal region of a first conductivity type within a semiconductor layer of the first conductivity type. A well region of a second conductivity type may be formed within the semiconductor layer wherein the well region is adjacent at least portions of the terminal region within the semiconductor layer, a depth of the well region into the semiconductor layer may be greater than a depth of the terminal region into the semiconductor layer, and the first and second conductivity types may be different. An epitaxial semiconductor layer may be formed on the semiconductor layer, and a terminal contact region of the first conductivity type may be formed in the epitaxial semiconductor layer with the terminal contact region providing electrical contact with the terminal region. In addition, an ohmic contact may be formed on the terminal contact region. Related structures are also discussed.

38 Claims, 4 Drawing Sheets

U.S. PATENT DOCUMENTS

| | | | |
|---|---|---|---|
| 5,170,455 | A | 12/1992 | Goossen et al. |
| 5,184,199 | A | 2/1993 | Fujii et al. |
| 5,270,554 | A | 12/1993 | Palmour |
| 5,348,895 | A | 9/1994 | Smayling et al. |
| 5,384,270 | A | 1/1995 | Ueno |
| 5,385,855 | A | 1/1995 | Brown et al. |
| 5,393,999 | A | 2/1995 | Malhi |
| 5,396,085 | A | 3/1995 | Baliga |
| 5,459,107 | A | 10/1995 | Palmour |
| 5,479,316 | A | 12/1995 | Smrtic et al. |
| 5,506,421 | A | 4/1996 | Palmour |
| 5,510,281 | A | 4/1996 | Ghezzo et al. |
| 5,510,630 | A | 4/1996 | Agarwal |
| 5,587,870 | A | 12/1996 | Anderson et al. |
| 5,629,531 | A | 5/1997 | Palmour |
| 5,710,059 | A | 1/1998 | Rottner |
| 5,726,463 | A | 3/1998 | Brown et al. |
| 5,734,180 | A | 3/1998 | Malhi |
| 5,739,564 | A | 4/1998 | Kosa et al. |
| 5,763,905 | A | 6/1998 | Harris |
| 5,804,483 | A | 9/1998 | Harris |
| 5,814,859 | A | 9/1998 | Ghezzo et al. |
| 5,837,572 | A | 11/1998 | Gardner et al. |
| 5,851,908 | A | 12/1998 | Harris et al. |
| 5,877,041 | A | 3/1999 | Fuller |
| 5,877,045 | A | 3/1999 | Kapoor |
| 5,885,870 | A | 3/1999 | Maiti et al. |
| 5,917,203 | A | 6/1999 | Bhatnagar et al. |
| 5,939,763 | A | 8/1999 | Hao et al. |
| 5,960,289 | A | 9/1999 | Tsui et al. |
| 5,972,801 | A | 10/1999 | Lipkin et al. |
| 5,976,936 | A | 11/1999 | Miyajima et al. |
| 6,020,600 | A | 2/2000 | Miyajima et al. |
| 6,025,233 | A | 2/2000 | Terasawa |
| 6,025,608 | A | 2/2000 | Harris et al. |
| 6,028,012 | A | 2/2000 | Wang |
| 6,040,237 | A | 3/2000 | Bakowski et al. |
| 6,048,766 | A | 4/2000 | Gardner et al. |
| 6,054,352 | A | 4/2000 | Ueno |
| 6,063,698 | A | 5/2000 | Tseng et al. |
| 6,096,607 | A | 8/2000 | Ueno |
| 6,100,169 | A | 8/2000 | Suvorov et al. |
| 6,107,142 | A | 8/2000 | Suvorov et al. |
| 6,117,735 | A | 9/2000 | Ueno |
| 6,133,587 | A | 10/2000 | Takeuchi et al. |
| 6,136,728 | A | 10/2000 | Wang |
| 6,165,822 | A | 12/2000 | Okuno et al. |
| 6,180,958 | B1 | 1/2001 | Cooper, Jr. |
| 6,190,973 | B1 | 2/2001 | Berg et al. |
| 6,204,135 | B1 | 3/2001 | Peters et al. |
| 6,204,203 | B1 | 3/2001 | Narwankar et al. |
| 6,211,035 | B1 | 4/2001 | Moise et al. |
| 6,221,700 | B1 | 4/2001 | Okuno et al. |
| 6,228,720 | B1 | 5/2001 | Kitabatake et al. |
| 6,238,967 | B1 | 5/2001 | Shiho et al. |
| 6,239,463 | B1 | 5/2001 | Williams et al. |
| 6,246,076 | B1 | 6/2001 | Lipkin et al. |
| 6,297,100 | B1 | 10/2001 | Kumar et al. |
| 6,297,172 | B1 | 10/2001 | Kashiwagi |
| 6,303,508 | B1 | 10/2001 | Alok |
| 6,316,791 | B1 | 11/2001 | Schorner et al. |
| 6,344,663 | B1 | 2/2002 | Slater, Jr. et al. |
| 6,399,996 | B1 | 6/2002 | Chang et al. |
| 6,420,225 | B1 | 7/2002 | Chang et al. |
| 6,429,041 | B1 | 8/2002 | Ryu et al. |
| 6,448,160 | B1 | 9/2002 | Chang et al. |
| 6,455,892 | B1 | 9/2002 | Okuno et al. |
| 6,551,865 | B2 | 4/2003 | Kumar et al. |
| 6,573,534 | B1 | 6/2003 | Kumar et al. |
| 6,593,620 | B1 | 7/2003 | Hshieh et al. |
| 6,610,366 | B2 | 8/2003 | Lipkin |
| 6,627,539 | B1 | 9/2003 | Zhao et al. |
| 6,653,659 | B2 | 11/2003 | Ryu et al. |
| 6,743,703 | B2 | 6/2004 | Rodov et al. |
| 6,956,238 | B2 | 10/2005 | Ryu et al. |
| 7,074,643 | B2 | 7/2006 | Ryu |
| 7,381,992 | B2 | 6/2008 | Ryu |
| 2001/0055852 | A1 | 12/2001 | Moise et al. |
| 2002/0030191 | A1 | 3/2002 | Das et al. |
| 2002/0038891 | A1 | 4/2002 | Ryu et al. |
| 2002/0047125 | A1 | 4/2002 | Fukuda et al. |
| 2002/0072247 | A1 | 6/2002 | Lipkin et al. |
| 2002/0102358 | A1 | 8/2002 | Das et al. |
| 2003/0137010 | A1 | 7/2003 | Friedrichs et al. |
| 2004/0104429 | A1* | 6/2004 | Takahashi et al. ............ 257/338 |
| 2004/0183080 | A1* | 9/2004 | Kusumoto et al. ............. 257/77 |
| 2004/0212011 | A1 | 10/2004 | Ryu |
| 2005/0181536 | A1* | 8/2005 | Tsuji ............................ 438/105 |
| 2008/0105949 | A1 | 5/2008 | Zhang et al. |
| 2008/0230787 | A1* | 9/2008 | Suzuki et al. ................... 257/77 |
| 2010/0295060 | A1* | 11/2010 | Kudou et al. ................... 257/77 |

FOREIGN PATENT DOCUMENTS

| | | |
|---|---|---|
| DE | 198 32 329 A1 | 2/1999 |
| DE | 19900171 | 7/1999 |
| DE | 10036208 A1 | 2/2002 |
| EP | 0637069 A1 | 2/1995 |
| EP | 1 058 317 A2 | 12/2000 |
| EP | 1 460 681 | 9/2004 |
| EP | 1460681 | 9/2004 |
| EP | 2 015 364 | 1/2009 |
| EP | 2015364 | 1/2009 |
| JP | 01117363 | 5/1989 |
| JP | 03034466 | 2/1991 |
| JP | 03157974 | 7/1991 |
| JP | 08264766 | 10/1996 |
| JP | 09205202 | 8/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 02000252461 A | 9/2000 |
| JP | 2000106371 A | 4/2001 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 99/63591 A1 | 12/1999 |
| WO | WO 00/13236 A3 | 3/2000 |
| WO | WO 01/78134 A1 | 10/2001 |
| WO | WO 2009/050871 * | 4/2009 |

OTHER PUBLICATIONS

Improved 4H-silicon carbide Schottky diodes using multiple METAL alloy CONTACTS; Pope, G.; Mawby, P.A.; Microelectronics, 2002. MIEL 2002. 23rd International Conference on Volume: 1 Digital Object Identifier: 10.1109/MIEL.2002.1003169 Publication Year: 2002 , pp. 181-183 vol. 1.*

International Preliminary Report on Patentability corresponding to International Application No. PCT/US2010/020071; Mailing Date: Jun. 30, 2011 (15 pages).

A.K. Agarwal, J.B. Casady, L.B. Rowland, W.F. Valek, and C.D. Brandt, "1400 V 4H-SiC Power MOSFET's," *Materials Science Forum* vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H- and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Baliga, Power Semiconductor Devices, Chapter 7, PWS Publishing, 1996.

Capano, M.A., et al., Ionization Energies and Electron Mobilities in Phosphorus- and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2O$-annealed $SiO_2$/SiC system," *Proceedings IEEE Hong Kong Electron Devices Meeting*. Jun. 24, 2000, pp. 108-111.

Chang et al. "Observation of a Non-stoichiometric Layer at the Silicon Dioxide-Silicon Carbide Interface: Effect of Oxidation Temperature and Post-Oxidation Processing Conditions," *Mat. Res. Soc. Symp. Proc.* vol. 640, 2001.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al., "The Effect of Si:C Source Ratio on $SiO_2$/SiC Interface State Density for Nitrogen Doped 4H and 6H-SiC," *Materials Science Forum*. (2000) Vols. 338-342, pp. 1097-1100.

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

International Search Report for PCT/US01/30715.

International Search Report for PCT/US02/11691 dated Dec. 4, 2002.

International Search Report for PCT/US01/42414, dated Apr. 23, 2002.

International Search Report and Written Opinion for corresponding International Application No. PCT/US2004/004982, dated Jul. 22, 2004.

D. Alok, E. Arnold, and R. Egloff, "Process Dependence of Inversion Layer Mobility in 4H-SiC Devices," *Materials Science Forum*, vols. 338-342, pp. 1077-1080, 2000.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

Dahlquist at al. "A 2.8kV, Forward Drop JBS Diode with Low Leakage," *Materials Science Forum*, vols. 338-342, (2000) pp. 1179-1182.

De Meo et al., "Thermal Oxidation of SiC in $N_2O$", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev at al., "Nitridation of Silicon-Dioxide Films Grown on 6H Silicon Carbide", *IEEE Electronic Device Letters*, vol. 18, No. 5, May 5, 1997, pp. 175-177.

Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

Fukuda et al. "Improvement of $SiO_2$/4H-SiC Interface by Using High Temperature Hydrogen Annealing at 1000° C," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

Jamet, at al. "Physical properties of $N_2O$ and NO-nitrided gate oxides grown on 4H SiC," *Applied Physics Letters*. vol. 79, No. 3, Jul. 16, 2001, pp. 323-325.

Kobayashi at al. "Dielectric Breakdown and Current Conduction of Oxide/Nitride/Oxide Multi-Layer Structures," *1990 IEEE Symposium on VLSI Technology*. pp. 119-120.

K. Ueno and Tadaaki Oikawa, "Counter-Doped MOSFETs of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

L.A. Lipkin and J.W. Palmour, "Low interface state density oxides on p-type SiC," Materials Science Forum vols. 264-268, pp. 853-856, 1998.

Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors", *Journal of Sol-Gel Science and Technology*. vol. 14 (1999) pp. 27-38.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.
Pantelides et al., "Atomic-Scale Engineering of the SiC-SiO2 Interface," *Materials Science Forum*. (2000) vols. 338-342, pp. 1133-1136.
Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).
R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.
R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.
Ranbir Singh, Sei-Hyung Ryu and John W. Palmour, "High Temperature, High Current, 4H-SiC Accu-DMOSFET," Materials Science Forum vols. 338-342, pp. 1271-1274, 2000.
Rao et al. "P-N Junction Formation in 6H-SiC by Acceptor Implantation into N-Type Substrate," Nuclear Instruments and Methods in Physics Research B. vol. 106, 1995, pp. 333-338.
Rao et al. "Al and N Ion Implantations in 6H-SiC," Silicon Carbide and Related Materials. 1995 Conf, Kyoto, Japan. Published 1996.
Ryu et al. Article and Presentation: "27 mΩ-cm², 1.6 kV Power DiMOSFETs in 4H-SiC," *Proceedings of the 14 International Symposium on Power Semiconductor Devices & ICs 2002*, Jun. 4-7, 2002, Santa Fe, NM.
S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.
S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.
Suzuki et al. "Effect of Post-oxidation-annealing in Hydrogen on $SiO_2$/4H-SiC Interface," *Materials Science Forum*, vols. 338-342 (2000) 1073-1076.
Sze, S.M. *Physics of Semiconductor Devices*, John Wiley & Sons, p. 383-390, 1981.
U.S. Appl. No. 60/435,212.
U.S. Appl. No. 60/294,307.
U.S. Appl. No. 10/422,130.
V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.
V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.
V.V. Afanasev, M. Bassler, G. Pensl, and M. Schulz, "Intrinsic SiC/$SiO_2$ Interface States," *Phy. Stat. Sol.* (a), vol. 162, pp. 321-337, 1997.
Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.
Williams et al. "Passivation of the 4H-SiC/$SiO_2$ Interface with Nitric Oxide," *Materials Science Forum*. vols. 389-393 (2002), pp. 967-972.
Xu et al. "Improved Performance and Reliability of $N_2O$-Grown Oxynitride on 6H-SiH," *IEEE Electron Device Letters*. vol. 21, No. 6, Jun. 2000, p. 298-300.
Y. Wang, C. Weitzel, and M. Bhatnagar, "Accumulation-Mode SiC Power MOSFET Design Issues," *Materials Science Forum*, vols. 338-342, pp. 1287-1290.
International Search Report and Written Opinion (14 pages) corresponding to International Application No. PCT/US2010/020071; Mailing Date: Mar. 26, 2010.

* cited by examiner

METHODS OF FORMING SEMICONDUCTOR DEVICES INCLUDING EPITAXIAL LAYERS AND RELATED STRUCTURES

STATEMENT OF GOVERNMENT RIGHTS

The U.S. Government has a paid-up license in this invention and the right in limited circumstances to require the patent owner to license others on reasonable terms as provided for by the terms of US Army Contract No. W911NF-04-2-0021 awarded by the US Army Research Laboratory.

FIELD OF THE INVENTION

This invention relates to electronics, and more particularly to methods of fabricating semiconductor devices and related structures.

BACKGROUND

Semiconductor power devices are widely used to carry large currents and support high voltages. Modern semiconductor power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

Recent development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "Comparison of 6H—SiC, 3C—SiC and Si for Power Devices", IEEE Transactions on Electron Devices, Vol. 40, 1993, pp. 645-655. A power MOSFET fabricated in silicon carbide is described in U.S. Pat. No. 5,506,421 to Palmour entitled "Power MOSFET in Silicon Carbide" and assigned to the assignee of the present invention.

A number of silicon carbide power MOSFET structures have been described in the literature. See e.g. U.S. Pat. No. 5,506,421; A. K. Agarwal, J. B. Casady, L. B. Rowland, W. F. Valek, M. H. White, and C. D. Brandt, "1.1 kV 4H—SiC Power UMOSFET's," IEEE Electron Device Letters, Vol. 18, No. 12, pp. 586-588, December 1997; A. K. Agarwal, J. B. Casady, L. B. Rowland, W. F. Valek and C. D. Brandt, "1400 V 4H—SiC Power MOSFETs," Materials Science Forum Vols. 264-268, pp. 989-992, 1998; J. Tan, J. A. Cooper, Jr., and M. R. Melloch, "High-Voltage Accumulation-Layer UMOSFETs in 4H—SiC," IEEE Electron Device Letters, Vol. 19, No. 12, pp. 487-489, December 1998; J. N. Shenoy, J. A. Cooper and M. R. Melloch, "High-Voltage Double-Implanted Power MOSFET's in 6H—SiC," IEEE Electron Device Letters, Vol. 18, No. 3, pp. 93-95, March 1997; J. B. Casady, A. K. Agarwal, L. B. Rowland, W. F. Valek, and C. D. Brandt, "900 V DMOS and 1100 V UMOS 4H—SiC Power FETs," IEEE Device Research Conference, Ft. Collins, Colo., Jun. 23-25, 1997; R. Schorner, P Friedrichs, D. Peters, H. Mitlehner, B. Weis and D. Stephani, "Rugged Power MOSFETs in 6H—SiC with Blocking Capability up to 1800 V," Materials Science Forum Vols. 338-342, pp. 1295-1298, 2000; V. R. Vathulya and M. H. White, "Characterization of Channel Mobility on Implanted SiC to determine Polytype suitability for the Power DIMOS structure," Electronic Materials Conference, Santa Barbara, Calif., Jun. 30-Jul. 2, 1999; A. V. Suvorov, L. A. Lipkin, G. M. Johnson, R. Singh and J. W. Palmour, "4H—SiC Self-Aligned Implant-Diffused Structure for Power DMOSFETs," Materials Science Forum Vols. 338-342, pp. 1275-1278, 2000; P. M. Shenoy and B. J. Baliga, "The Planar 6H—SiC ACCUFET: A New High-Voltage Power MOSFET Structure," IEEE Electron Device Letters, Vol. 18, No. 12, pp. 589-591, December 1997; Ranbir Singh, Sei-Hyung Ryu and John W. Palmour, "High Temperature, High Current, 4H—SiC Accu-DMOSFET," Materials Science Forum Vols. 338-342, pp. 1271-1274, 2000; Y. Wang, C. Weitzel and M. Bhatnagar, "Accumulation-Mode SiC Power MOSFET Design Issues," Materials Science Forum Vols. 338-342, pp. 1287-1290, 2000; A. K. Agarwal, N. S. Saks, S. S. Mani, V. S. Hegde and P. A. Sanger, "Investigation of Lateral RESURF, 6H—SiC MOSFETs," Materials Science Forum Vols. 338-342, pp. 1307-1310, 2000; and Shenoy et al., "High-Voltage Double-Implanted Power MOSFET's in 6H—SiC," IEEE Electron Device Letters, Vol. 18, No. 3, March 1997, pp. 93-95.

One widely used silicon power MOSFET is the double diffused MOSFET (DMOSFET) that is fabricated using a double-diffusion process. A conventional DMOSFET 510 in silicon is illustrated in FIG. 5. In the device of FIG. 5, a p-base region 514 and an n$^+$ source region 516 are diffused in a substrate 512 through a common opening in a mask. The p-base region 514 is driven in deeper than the n$^+$ source region 516. The difference in the lateral diffusion between the p-base 514 and n$^+$ source regions 516 forms a surface channel region. A gate oxide 518 is provided on the substrate 512 and a gate electrode 520 is provided on the gate oxide 518. A source contact 522 is provided on the substrate 512 on and between the n$^+$ source regions 516. A drain contact 524 is provided on the substrate 512 opposite the source contact 522. An overview of power MOSFETs including DMOSFETs may be found in the textbook entitled "Power Semiconductor Devices" by B. J. Baliga, published by PWS Publishing Company, 1996, and specifically in Chapter 7, entitled "Power MOSFET", the disclosure of which is hereby incorporated herein by reference. The DMOSFET structure has also been fabricated in silicon carbide. Because of the low diffusion of dopants in silicon carbide, however, other doping techniques, such as ion implantation, have been used in fabricating DMOSFETs in silicon carbide. Thus, the term "DMOSFET" is used herein to refer to a structure similar to that of FIG. 5 having a base or well region and source regions in the base or well region irrespective of the methods used in fabricating the structure.

Notwithstanding the potential advantages of silicon carbide, it may be difficult to fabricate power devices including power MOSFETs in silicon carbide. For example, as described above, the DMOSFET is generally fabricated in silicon using a double diffusion process wherein the p-base region is driven in deeper than the n+ source. Unfortunately, in silicon carbide, the diffusion coefficients of conventional p-type and n-type dopants are small compared to silicon, so that it may be difficult to obtain the required depths of the p-base and n+ source regions using acceptable diffusion times and temperatures. Ion implantation may also be used to implant the p-base and the n+ source. See, for example, the reference by Shenoy et al. entitled "High-Voltage Double-Implanted Power MOSFET's in 6H—SiC", IEEE Electron Device Letters, Vol. 18, No. 3, March 1997, pp. 93-95.

SUMMARY

According to some embodiments of the present invention, a method of forming a semiconductor device may include forming a terminal region of a first conductivity type within a semiconductor layer of the first conductivity type, and forming a well region of a second conductivity type within the semiconductor layer. The well region may be adjacent at least portions of the terminal region within the semiconductor layer, a depth of the well region into the semiconductor layer may be greater than a depth of the terminal region into the semiconductor layer, and the first and second conductivity types may be different. An epitaxial semiconductor layer may be formed on the semiconductor layer, and a terminal contact region of the first conductivity type may be formed in the epitaxial semiconductor layer, with the terminal contact region providing electrical contact with the terminal region. In addition, an ohmic contact may be formed on the terminal contact region.

Portions of the well region between the terminal region and an outer perimeter of the well region adjacent a surface of the semiconductor layer may define a channel, a gate insulating layer may be formed on the epitaxial semiconductor layer opposite the channel, and a gate electrode may be formed on the gate insulating layer opposite the channel. After forming the epitaxial semiconductor layer, a well contact region of the second conductivity type may be formed through central portions of the terminal contact region and the terminal region with the well contact region providing electrical contact with the well region. The ohmic contact may include a first metal layer on the terminal contact region and on the well contact region, a second metal layer on portions of the first metal layer opposite the well contact region, and a silicon layer on portions of the first metal layer opposite the terminal contact region surrounding the second metal layer.

The epitaxial semiconductor layer may include an epitaxial silicon carbide layer, and the epitaxial silicon carbide layer may have a thickness in the range of about 1200 Angstroms (120 nanometers) to about 1800 Angstroms (180 nanometers). Moreover, the first conductivity type may be n-type and the second conductivity type may be p-type.

Forming the epitaxial semiconductor layer may include forming the epitaxial semiconductor layer having the first conductivity type at a first dopant concentration, forming the terminal contact region may include forming the terminal contact region having the first conductivity type at a second dopant concentration, and the second dopant concentration may be at least two orders of magnitude greater than the first dopant concentration. An outer edge of the terminal contact region may be set back from an outer edge of the terminal region around a perimeter of the terminal region. More particularly, the outer edge of the terminal contact region may be set back from the outer edge of the terminal region by at least about 0.1 micrometers.

According to other embodiments of the present invention, a semiconductor device may include a semiconductor layer having a first conductivity type, a terminal region of the first conductivity type within the semiconductor layer, and a well region of a second conductivity type within the semiconductor layer. The well region may be adjacent at least portions of the terminal region within the semiconductor layer, a depth of the well region into the semiconductor layer may be greater than a depth of the terminal region into the semiconductor layer, and the first and second conductivity types may be different. An epitaxial semiconductor layer may be provided on the semiconductor layer including the terminal region and the well region, the epitaxial semiconductor layer may include a terminal contact region of the first conductivity type therein, and the terminal contact region may provide electrical contact with the terminal region. In addition, an ohmic contact may be provided on the terminal contact region.

An outer edge of the terminal contact region may be set back from an outer edge of the terminal region around a perimeter of the terminal region. More particularly, the outer edge of the terminal contact region may be set back from the outer edge of the terminal region by at least about 0.1 micrometers. Portions of the well region adjacent a surface of the semiconductor layer between the terminal region and an outer perimeter of the well region may define a channel, a gate insulating layer may be provided on the epitaxial semiconductor layer opposite the channel, and a gate electrode may be provided on the gate insulating layer opposite the channel.

A well contact region of the second conductivity type may be provided through central portions of the terminal contact region and the terminal region with the well contact region providing electrical contact with the well region. Moreover, the ohmic contact may include a first metal layer on the terminal contact region and on the well contact region, a second metal layer on portions of the first metal layer opposite the well contact region, and a silicon layer on portions of the first metal layer opposite the terminal contact region surrounding the second metal layer.

The epitaxial semiconductor layer may include an epitaxial silicon carbide layer, and the epitaxial silicon carbide layer may have a thickness in the range of about 1200 Angstroms (120 nanometers) to about 1800 Angstroms (180 nanometers). The first conductivity type may be n-type and the second conductivity type may be p-type. Portions of the epitaxial semiconductor layer outside the well region may have the first conductivity type at a first dopant concentration, the terminal contact region may have the first conductivity type at a second dopant concentration, and the second dopant concentration may be at least two orders of magnitude greater than the first dopant concentration.

According to still other embodiments of the present invention, a method of forming a semiconductor device may include forming a terminal region of a first conductivity type within a semiconductor layer of the first conductivity type, and forming a well region of a second conductivity type within the semiconductor layer. The well region may be adjacent at least portions of the terminal region within the semiconductor layer, a depth of the well region into the semiconductor layer may be greater than a depth of the terminal region into the semiconductor layer, and the first and second conductivity types may be different. An epitaxial semiconductor layer may be formed on the semiconductor layer including the terminal region and the well region, the epitaxial semiconductor layer may include a terminal contact region of the first conductivity type therein, and the terminal contact region may provide electrical contact with the terminal region. In addition, an ohmic contact may be formed on the terminal contact region.

An outer edge of the terminal contact region may be set back from an outer edge of the terminal region around a perimeter of the terminal region. More particularly, the outer edge of the terminal contact region may be set back from the outer edge of the terminal region by at least about 0.1 micrometers.

Portions of the well region adjacent a surface of the semiconductor layer between the terminal region and an outer perimeter of the well region may define a channel, a gate insulating layer may be formed on the epitaxial semiconductor layer opposite the channel, and a gate electrode may be formed on the gate insulating layer opposite the channel. The ohmic contact may include a metal layer on the terminal contact region. A well contact region of the second conductivity type may be formed through central portions of the terminal contact region and the terminal region with the well contact region providing electrical contact with the well region. The epitaxial semiconductor layer may include an epitaxial silicon carbide layer, and the epitaxial silicon carbide layer may have a thickness in the range of about 1200 Angstroms (120 nanometers) to about 1800 Angstroms (180 nanometers).

According to yet other embodiments of the present invention, a method of forming a semiconductor device may include providing a semiconductor layer of a first conductivity type. The semiconductor layer may include a terminal region of a first conductivity type within the semiconductor layer and a well region of a second conductivity type within the semiconductor layer, and the well region may be adjacent at least portions of the terminal region within the semiconductor layer. A depth of the well region into the semiconductor layer may be greater than a depth of the terminal region into the semiconductor layer, and the first and second conductivity types may be different. An epitaxial semiconductor layer may be formed on the semiconductor layer, and a terminal contact region of the first conductivity type may be formed through the epitaxial semiconductor layer with the terminal contact region providing electrical contact with the terminal region. In addition, an ohmic contact may be formed on the terminal contact region.

Portions of the well region between the terminal region and an outer perimeter of the well region adjacent a surface of the semiconductor layer may define a channel, a gate insulating layer may be formed on the epitaxial semiconductor layer opposite the channel, and a gate electrode may be formed on the gate insulating layer opposite the channel. Moreover, the epitaxial semiconductor layer may include an epitaxial silicon carbide layer.

Forming the epitaxial semiconductor layer may include forming the epitaxial semiconductor layer having the first conductivity type at a first dopant concentration, forming the terminal contact region may include forming the terminal contact region having the first conductivity type at a second dopant concentration, and the second dopant concentration may be at least two orders of magnitude greater than the first dopant concentration. An outer edge of the terminal contact region may be set back from an outer edge of the terminal region around a perimeter of the terminal region.

DETAILED DESCRIPTION

Figure 1A:
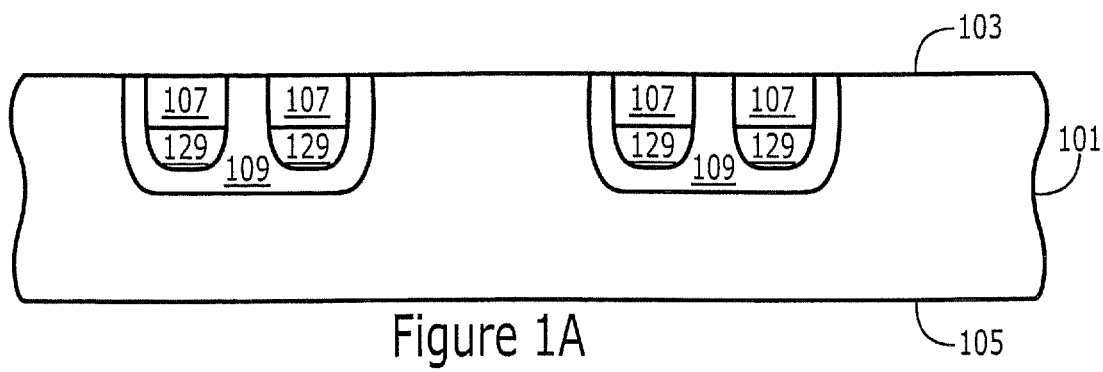
FIGS. 1A, 2, 3A, and 4A are cross sectional views illustrating operations of forming a semiconductor device according to some embodiments of the present invention.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 4A:
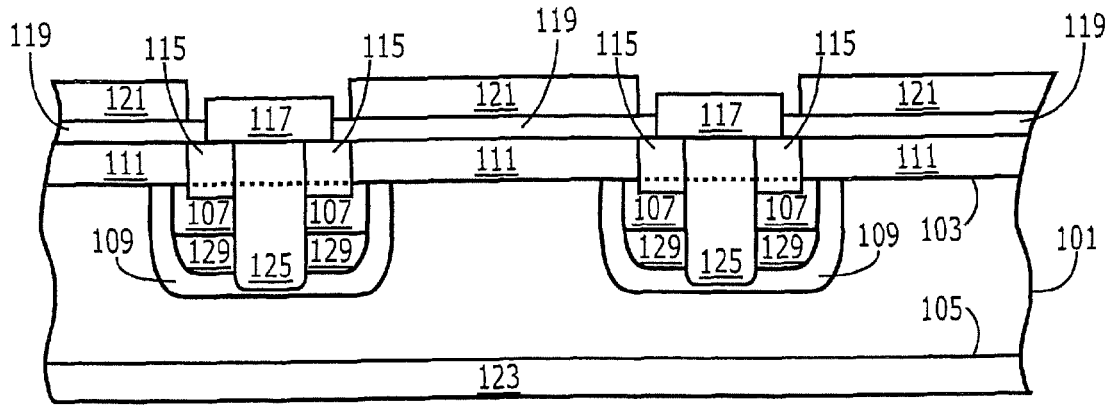
Figure 4B:
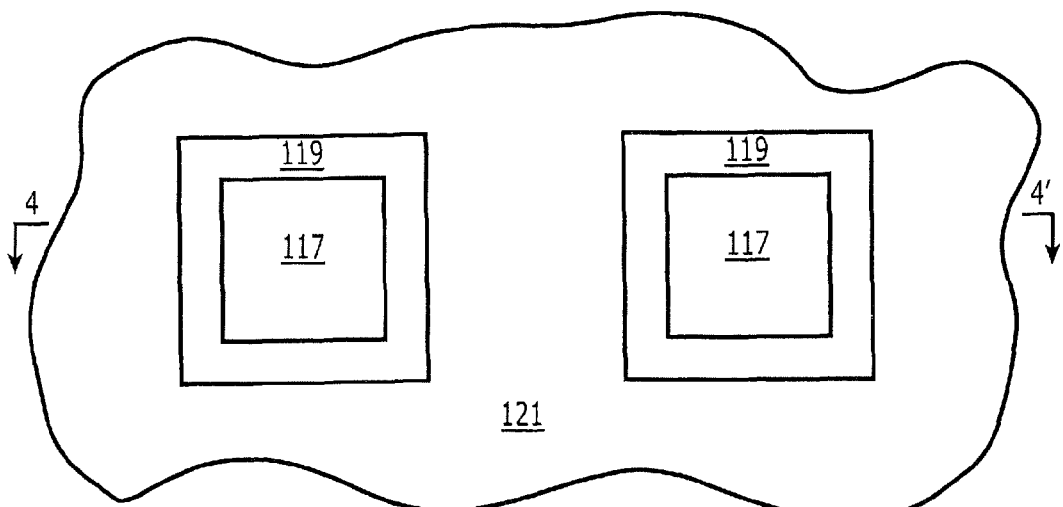
FIG. 4B is a plan view corresponding to FIG. 4A such that the cross section of FIG. 4A is taken along section line 4-4' of FIG. 4B.

FIG. 4A is a cross sectional view illustrating a DMOSFET (double diffused Metal Oxide Semiconductor Field Effect Transistor) according to some embodiments of the present invention, and FIG. 4B is a plan view such that the cross sectional view of FIG. 4A is taken along section line 4-4' of FIG. 4B. As shown, the DMOSFET of FIGS. 4A and 4B may include a semiconductor layer 101 (e.g., a silicon carbide layer and/or substrate) having a first conductivity type (e.g., n-type conductivity) and opposing surfaces 103 and 105. Source/drain terminal regions 107 of the first conductivity type may be formed at/in surface 103 of semiconductor layer 101, and well regions 109 of a second conductivity type (e.g., p-type conductivity) may be formed at/in surface 103 of a semiconductor layer 101 with well regions 109 surrounding respective source/drain terminal regions 107 at surface 103 of the semiconductor layer 101. As shown, a depth of well regions 109 into the semiconductor layer 101 may be greater than a depth of source/drain terminal regions 107 into semiconductor layer 101, and the first and second conductivity types are different. For example, a depth of source/drain terminal regions 107 into layer 103 may be about 2000 Angstroms (200 nanometers) or less.

Epitaxial semiconductor layer 111 (e.g., epitaxial silicon carbide layer) may be provided on surface 103 of semiconductor layer 101 including source/drain terminal regions 107 and well regions 109. Moreover, epitaxial semiconductor layer 111 may include source/drain terminal contact regions 115 of the first conductivity type therethrough, and terminal contact regions 115 may provide electrical contact with source/drain terminal regions 107. Outer edges of terminal contact regions 115 may be set back from outer edges of source/drain terminal regions 107 around perimeters of source/drain terminal regions 107. In addition, ohmic contacts 117 (e.g., metal contacts) may be provided on terminal contact regions 115, gate insulating layer 119 (e.g., a silicon oxide layer) may be provided on epitaxial semiconductor layer 111, and gate electrode 121 (e.g., a degeneratively doped polysilicon gate electrode) may be provided on gate insulating layer 119. Accordingly, portions of well regions 109 adjacent surface 103 of semiconductor layer 101 between source/drain terminal regions 107 and outer perimeters of well regions 109 may define channels of the DMOSFET device.

As further shown in FIGS. 4A and 4B, ohmic contact 123 may be provided on surface 105 of semiconductor layer 101 to define a vertical transistor structure so that current flow is between ohmic contacts 117 and 123 on opposite sides of layer 101. Moreover, well contact regions 125 of the second conductivity type may be provided through central portions of terminal contact regions 115 and source/drain terminal regions 107 to provide electrical contact between ohmic contacts 117 and well regions 109. Ohmic contacts 117 may thus be configured to provide ohmic contact with terminal contact regions 115 and with well contact regions 125 of opposite conductivity types.

Figure 4C:
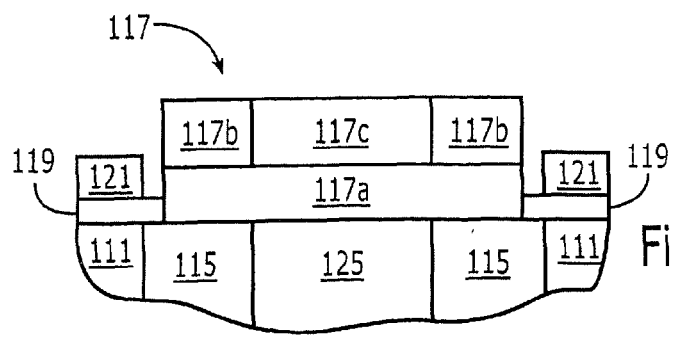
FIG. 4C is a greatly enlarged cross sectional view of an ohmic contact of FIGS. 4A and 4B.
Figure 5:
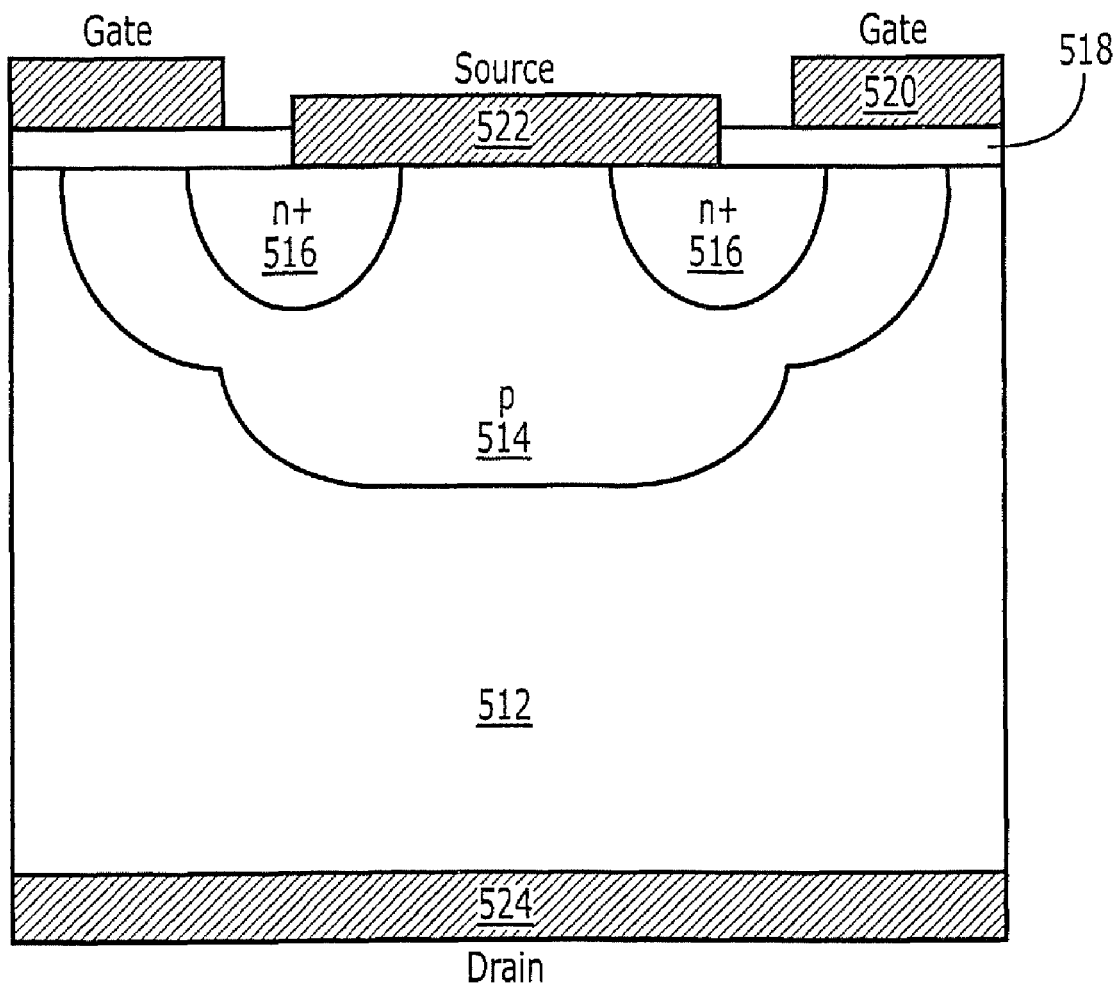
FIG. 5 is a cross-sectional view of a conventional DMOSFET.

As shown in FIG. 4C, for example, ohmic contact 117 may include a metal layer 117a (e.g., a nickel layer) on portions of terminal contact regions 115 of the first conductivity type and on well contact regions 125 of the second conductivity type. With n-type terminal contact regions 115, a semiconductor layer 117b (e.g., a silicon layer) may be provided on portions of metal layer 117a opposite terminal contact regions 115. With p-type well contact regions 125, a metal layer 117c (e.g., an aluminum layer) may be provided on portions of metal layer 117a opposite well region 125 such that the metal layers 117a and 117c comprise different metals. While the ohmic contact structure of FIG. 4C is provided by way of example, other ohmic contact metallurgies and/or structures may be used according to other embodiments of the present invention.

In the DMOSFET of FIGS. 4A and 4B, portions of well regions 109 adjacent surface 103 of semiconductor layer 101 between terminal regions 107 and outer perimeters of well regions 109 may define a channel, the conductivity of which may be controlled by gate electrode(s) 121. Accordingly, when the DMOSFET is turned on, current may flow between ohmic contacts 117 and 125 through terminal contact regions 115, terminal regions 107, channels of well regions 109, epitaxial semiconductor layer 111, and layer 101. The epitaxial semiconductor layer 111 may be sufficiently thin so that portions thereof adjacent well regions 109 may be fully depleted of carriers when the DMOSFET is turned off (e.g., a zero voltage gate bias is applied to gate electrode 121) even if the epitaxial semiconductor layer 111 has the first conductivity type. More particularly, a dopant concentration of well regions 109 of the second conductivity type may be sufficiently high so that portions of epitaxial semiconductor layer 111 (of the first conductivity type) adjacent well regions 109 are depleted in the absence of an electrical field generated from gate electrode 121. Accordingly, epitaxial semiconductor layer 111 may provide a relatively high quality conducting channel that isolates carrier (e.g., electron) flow from portions of well regions 109 adjacent thereto.

As further shown in FIG. 4A, outer edges of terminal contact regions 115 may be set back from outer edges of terminal regions 107 in a direction parallel with respect to surface 103 of semiconductor layer 101. Accordingly, a likelihood of breakdown around/through the channel may be reduced when the device is turned off. Outer edges of terminal contact regions 115 may be set back from outer edges of terminal regions 107 by at least about 0.1 micrometers, and more particularly, a set back of outer edges of terminal contact regions 115 relative to outer edges of terminal regions 107 may be at least about 0.2 micrometers, and still more particularly, at least about 0.4 micrometers. For example, outer edges of terminal contact regions 115 may be set back relative to outer edges of terminal regions in a range of about 0.4 micrometers to about 0.5 micrometers.

The layer 101 may be a silicon carbide (SiC) layer and/or substrate having an n-type conductivity, and the epitaxial semiconductor layer 111 may be an epitaxial silicon carbide layer having an n-type conductivity. More particularly, the epitaxial semiconductor layer 111 may be an epitaxial silicon carbide layer having a thickness in the range of about 1200 Angstroms (120 nanometers) to about 1800 Angstroms (180 nanometers), and more particularly, having a thickness in the range of about 1400 Angstroms (140 nanometers) to about 1600 Angstroms (160 nanometers). For example, the epitaxial semiconductor layer 111 may be an epitaxial silicon carbide layer having a thickness of about 1500 Angstroms (150 nanometers). As used herein, the term epitaxial refers to a substantially single crystal semiconductor layer having a crystal lattice structure that is substantially matched with a crystal lattice structure of an underlying semiconductor layer/substrate on which the epitaxial layer is formed.

According to some embodiments of the present invention, the layer 101 may be a silicon carbide layer and/or substrate, the epitaxial semiconductor layer 111 may be a silicon carbide layer, the first conductivity type (of source/drain terminal regions 107, terminal contact regions 115, layer 101, and epitaxial layer 111) may be n-type, and the second conductivity type (of well regions 109 and well contact regions 125) may be p-type. Accordingly, the DMOSFET of FIGS. 4A and 4B may be a silicon carbide n-channel DMOSFET. Moreover, portions of epitaxial semiconductor layer 111 outside well regions 109 may have the first conductivity type (e.g., n-type) at a first dopant concentration, and terminal contact regions 115 through epitaxial layer 111 may have the first conductivity type (e.g., n-type) at a second dopant concentration, with the second dopant concentration being at least two orders of magnitude greater than the first dopant concentration.

In an n-channel device, source/drain terminal regions 107, terminal contact regions 115, layer 101, and epitaxial semiconductor layer 111 may be doped with an n-type element(s) from column V of the periodic table (e.g., nitrogen, phosphorus, etc.), and well regions 109 and well contact regions 125 may be doped with a p-type element(s) from column III of the periodic table (e.g., boron, aluminum, etc.). Moreover, optional heavily doped regions 129 of the second conductivity type (e.g., p-type) may be provided between source/drain terminal regions 107 and lower edges of well regions 109. A dopant concentration of heavily doped regions 129 can be significantly greater (e.g., at least two orders of magnitude greater) than a dopant concentration of well regions 109. Similarly, a dopant concentration of well contact regions 125 may be significantly greater (e.g., at least two orders of magnitude greater) than a dopant concentration of well regions 109. In addition, a dopant concentration of terminal contact regions 115 may be significantly greater (e.g., at least two orders of magnitude greater) than a dopant concentration of source/drain terminal regions 107 and/or epitaxial semiconductor layer 111 (outside contact regions 125 and 117). For example, portions of epitaxial semiconductor layer 111 spaced apart from well regions 109 may have a dopant concentration of about $1\times10^{17}$ cm$^{-3}$ or less (e.g., about $3\times10^{16}$ cm$^{-3}$) and terminal contact regions 115 (through epitaxial semiconductor layer 111) may have a dopant concentration of about $1\times10^{19}$ cm$^{-3}$ or greater. Moreover, portions of epitaxial semiconductor layer 111 spaced apart from well regions 109 may have a dopant concentration that is greater than a dopant concentration of semiconductor layer 101. For example, epitaxial semiconductor layer 111 may have a dopant concentration that is at least about 5 times greater than a dopant concentration of semiconductor layer 101, and more particularly at least about 1 order of magnitude greater than a dopant concentration of semiconductor layer 101.

As shown in FIG. 4A, terminal contact regions 115 and well contact regions 125 may extend through epitaxial semiconductor layer 111 and into well regions 109 and/or source/drain terminal regions 107 of layer 101. Dotted lines are provided to indicate portions of terminal contact regions 115 and well contact regions 125 in epitaxial semiconductor layer 111 and in well regions 109 and/or source/drain terminal regions 107 of layer 101.

Figure 1B:
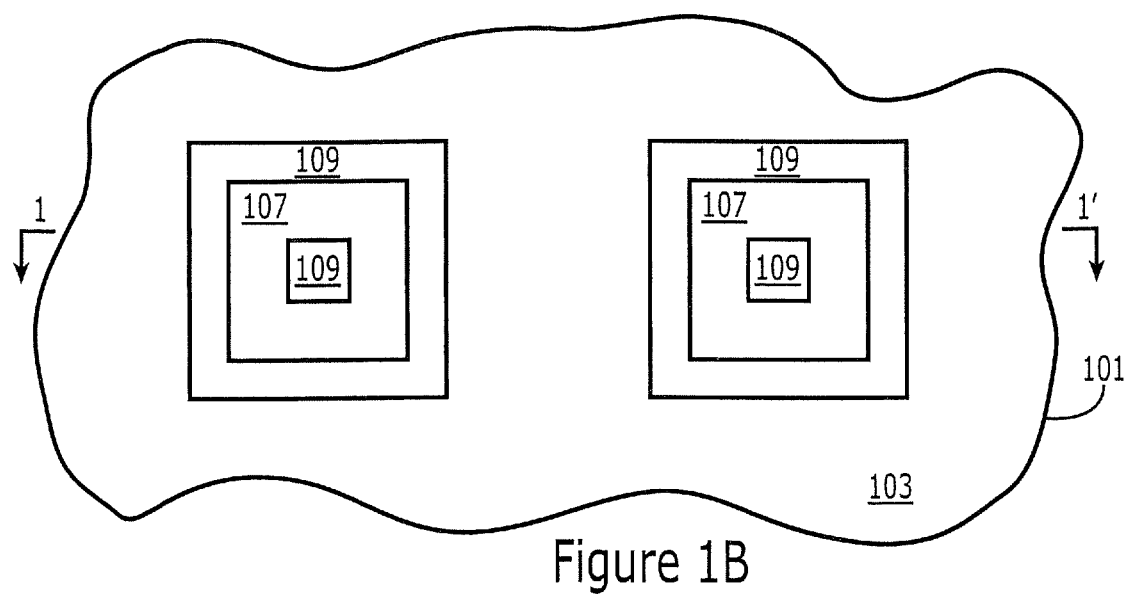
FIG. 1B is a plan view corresponding to FIG. 1A such that the cross section of FIG. 1A is taken along section line 1-1' of FIG. 1B.

Operations of forming a semiconductor device, such as a silicon carbide DMOSFET according to some embodiments of the present invention will now be discussed with respect to the cross sectional views of FIGS. 1A, 2, 3A, and 4A, and with respect to corresponding plan views of FIGS. 1B, 3B, and 4B. As shown in FIGS. 1A and 1B, source/drain terminal regions 107 of the first conductivity type (e.g., n-type), buried regions 129 of the second conductivity type (e.g., p-type), and well regions 109 of the second conductivity type (e.g., p-type) may be implanted into surface 101 of single crystal semiconductor layer 101 (e.g., silicon carbide layer and/or substrate) of the first conductivity type (e.g., n-type). More particularly, a source/drain implant mask may be used to selectively expose portions of surface 103 for implanting source/drain terminal regions 107 and buried regions 129 of opposite conductivity types. The source/drain implant mask, for example, may cover all portions of surface 103 except those portions into which source/drain terminal regions 107 are to be formed. Such a source/drain implant mask, for example, would cover portions of FIG. 1B labeled 103 and 109, while exposing portions labeled 107. Portions of semiconductor layer 101 outside well regions 109, for example, may have a dopant concentration less than about $1\times10^{16}$ cm$^{-3}$, and more particularly, less than about $5\times10^{15}$ cm$^{-3}$, and still more particularly, less than about $5\times10^{14}$ cm$^{-3}$.

Different implant energies may be used to implant terminal regions 107 and buried regions 129 at different depths using the same implant mask. Formation of n-type source regions and p-type buried regions is discussed, for example, in U.S. Pat. No. 7,074,643 to Ryu entitled "Silicon Carbide Power Devices With Self-Aligned Source and Well Regions And Methods Of Fabrication Same." Implants are further discussed by Shenoy et al. entitled "High-Voltage Double-Implanted Power MOSFET's in 6H—SiC", IEEE Electron Device Letters, Vol. 18, No. 3, March 1997, pp. 93-95. The disclosures of both of the above referenced documents are hereby incorporated herein in their entirety by reference.

After forming source/drain terminal regions 107 and buried regions 129, the source/drain implant mask may be subjected to a timed etch (without requiring a second photolithographic patterning) to thereby widen the previously defined openings for the source/drain terminal regions. The resulting well implant mask may thus have widened openings (relative to the source/drain implant mask) to cover portions of FIG. 1B labeled 103 while exposing portions labeled 107 and 109. The well implant mask may thus be used to implant well regions 109 surrounding source/drain terminal regions 107, and well regions 109 may be formed by implanting dopants of the second conductivity type into layer 101 through the well implant mask. While dopants of the second conductivity type may also be implanted into source/drain terminal regions 107, a dopant concentration of the first conductivity type in source/drain terminal regions 107 may be sufficiently high so that the first conductivity type may be maintained in the source/drain terminal regions 107. Accordingly, the well implant mask may be self-aligned with respect to the source/drain implant mask so that both masks may be provided using a same mask layer and using only one photolithographic patterning operation. Formation of self-aligned source and well regions is discussed, for example, in U.S. Pat. No. 7,074,643 to Ryu, the disclosure of which is hereby incorporated herein in its entirety by reference.

Once source/drain terminal regions 107, buried regions 129, and well regions 109 have been implanted, the well implant mask may be removed, and a thermal anneal may be performed to activate implanted dopants and/or to anneal implant damage at surface 103 of layer 101. In an alternative, subsequent thermal operations (e.g., growth of epitaxial semiconductor layer) may provide sufficient annealing so that a separate thermal anneal is not required.

Source/drain terminal regions 107 and layer 101 may be doped with an n-type element(s) from column V of the periodic table (e.g., nitrogen, phosphorus, etc.), and well regions 109 and buried regions 129 may be doped with a p-type element(s) from column III of the periodic table (e.g., boron, aluminum, etc.). Source/drain terminal regions 107, for example, may be doped with nitrogen to reduce crystal damage at surface 103 of layer 101, and buried regions 129 and well regions 109 may be doped with aluminum.

Figure 2:
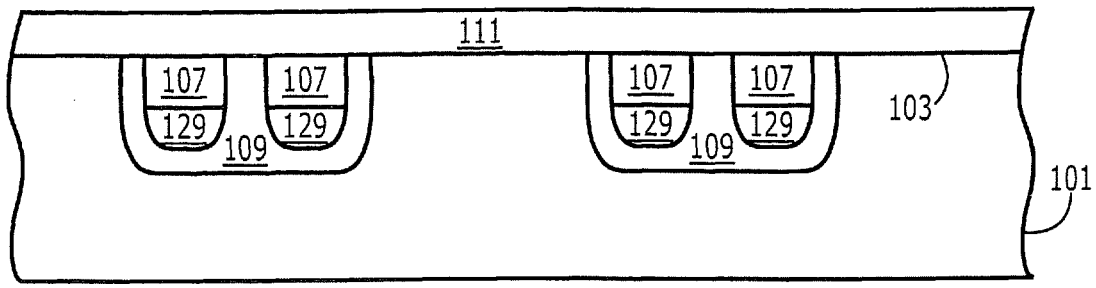

As shown in FIG. 2, a relatively thin epitaxial semiconductor layer 111 (e.g., a silicon carbide layer) may be formed (e.g., using chemical vapor deposition) on surface 103 of layer 101 including source/drain terminal regions 107 and well regions 109. Epitaxial semiconductor layer 111, for example, may have a thickness in the range of about 1200 Angstroms (120 nanometers) to about 1800 Angstroms (180 nanometers), and more particularly, the epitaxial semiconductor layer may have a thickness in the range of about 1400 Angstroms (140 nanometers) to about 1600 Angstroms (160 nanometers). Epitaxial semiconductor layer 111, for example, may have n-type conductivity with a dopant concentration of less than about $1 \times 10^{17}$ cm$^{-3}$. For example, the epitaxial semiconductor layer 111 may be formed as an epitaxial silicon carbide layer doped with nitrogen having a thickness of about 1500 Angstroms (150 nanometers) and a dopant concentration of about $3 \times 10^{16}$ cm$^{-3}$. As noted above, epitaxial semiconductor layer 111 may provide a relatively high quality conducting channel that isolates carrier (e.g., electron) flow from portions of well regions 109 adjacent thereto. Epitaxial semiconductor layer 111 may thus have a dopant concentration that is at least about 5 times greater than a dopant concentration of portions of semiconductor layer 101 (outside well regions 109), and more particularly at least about 1 order of magnitude greater than a dopant concentration of portions of semiconductor layer 101 (outside well regions 109).

Figure 3A:
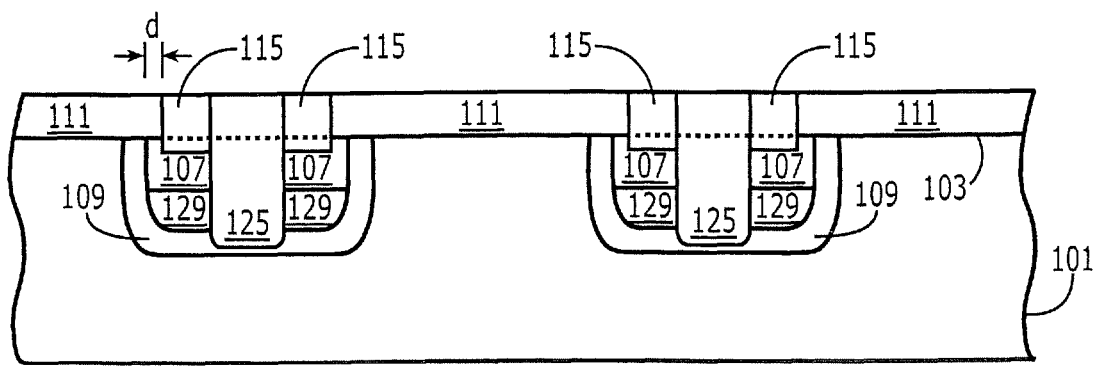
Figure 3B:
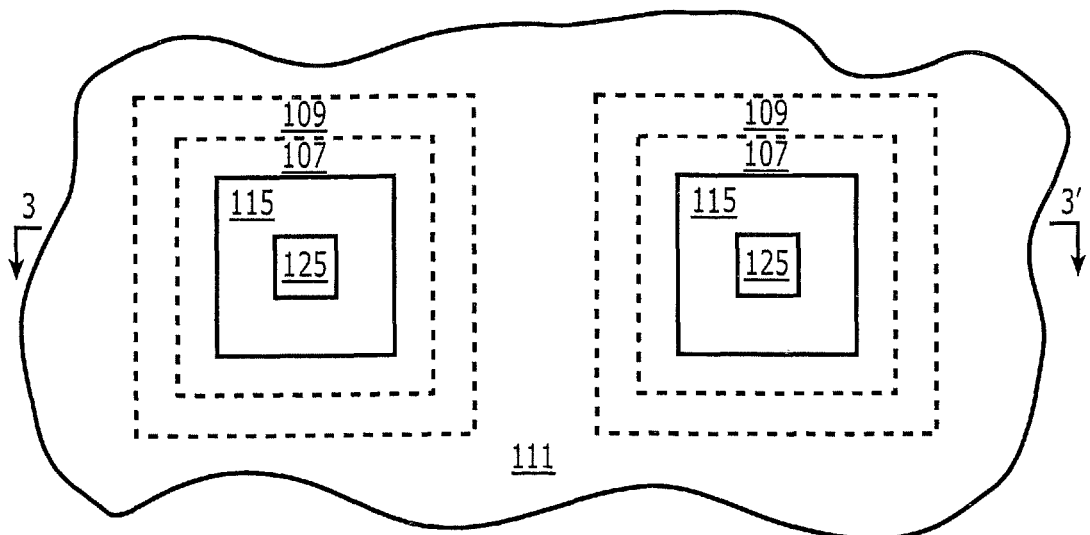
FIG. 3B is a plan view corresponding to FIG. 3A such that the cross section of FIG. 3A is taken along section line 3-3' of FIG. 3B.

As shown in FIGS. 3A and 3B, terminal contact regions 115 of the first conductivity type (e.g., n-type) and well contact regions 125 of the second conductivity type (e.g., p-type) may be implanted through epitaxial semiconductor layer 111 to provide electrical contact with source/drain terminal regions 107 and well regions 109, respectively. Terminal contact regions 115 may be doped with an element(s) selected from Column V of the periodic table (e.g., nitrogen, phosphorus, etc.), and well contact regions 125 may be doped with an element(s) selected from Column III of the periodic table (e.g., boron, aluminum, etc.). More particularly, terminal contact regions 115 may be doped with phosphorus to provide reduced resistance and/or to provide improved contact with a subsequently formed metal layer. Moreover, a dopant concentration of terminal contact regions 115 may be significantly greater (e.g., two orders of magnitude greater) than a dopant concentration of terminal regions 107 and/or epitaxial semiconductor layer 111, and a dopant concentration of well contact region 125 may be significantly greater (e.g., two orders of magnitude greater) than a dopant concentration of well region 109.

Implanted contact regions 115 and 125 may thus provide electrical contact through epitaxial semiconductor layer 111 instead of removing portions of epitaxial semiconductor layer 111 to expose source/drain terminal regions 107 and well region 109. Accordingly, an operation of etching epitaxial semiconductor layer 111 (which may be difficult to control) may be omitted, and/or improved electrical contact with source/drain terminal regions 107 and/or well region 109 may be provided.

As further shown in FIG. 3A, outer edges of terminal contact regions 115 may be set back by a distance d from outer edges of source/drain terminal regions 107 around perimeters of source/drain terminal regions 107. Outer edges of terminal contact regions 115, for example, may be set back from outer edges of terminal regions 107 by a distance d (in a direction parallel with respect to surface 103 of layer 101) of at least about 0.1 micrometers, and more particularly, by a distance d of at least about 0.2 micrometers, and still more particularly, by a distance d of at least about 0.4 micrometers. For example, outer edges of terminal contact regions 115 may be set back relative to outer edges of terminal regions 107 by a distance d in the range of about 0.4 micrometers to about 0.5 micrometers. By providing a sufficient set back, a distance d between the relatively highly doped terminal contact regions 115 and channel regions may be increased thereby improving transistor performance.

Because terminal contact regions 115 are not used to provide active junction regions of the transistor, crystal damage is of reduced concern. Accordingly, terminal contact regions 115 may be implanted at a relatively high dopant concentration with an element such as phosphorus to provide reduced resistance and/or improved ohmic contact even if phosphorus may result in greater crystal damage than other n-type dopants. After implanting terminal contact regions 115 and well contact regions 125, a second thermal anneal may be performed to activate dopants of contact regions 115 and 125.

Gate insulating layer 119, gate electrode 121, and ohmic contacts 117 and 123 may then be formed as shown in FIGS. 4A, 4B, and 4C. Gate insulating layer 119 may be a layer of silicon oxide, and gate electrode 121 may be a layer of degeneratively doped polysilicon. As discussed above, each ohmic contact 117 may include metal layer 117a (e.g., a nickel layer), doped silicon layer 117b on portions of metal layer 117a opposite terminal contact regions 115, and metal layer 117c (e.g., an aluminum layer). Ohmic contact 123 may be a metal layer on surface 105 of layer 101. While not shown in FIG. 4A, layer 101 may include a relatively highly doped region of the first conductivity type adjacent surface 105 to improve electrical contact with ohmic contact 123. Operations of forming gate insulating layers, gate electrodes, and/or ohmic contacts are discussed by way of example in: U.S. Pat. No. 7,074,643 to Ryu entitled "Silicon Carbide Power Devices With Self-Aligned Source And Well Regions And Methods Of Fabricating Same"; U.S. Pat. No. 7,381,992 to Ryu entitled "Silicon Carbide Power Devices With Self-Aligned Source And Well Regions"; U.S. Pat. No. 6,653,659 to Ryu et al. entitled "Silicon Carbide Inversion Channel MOSFETs"; and U.S. Pat. No. 6,956,238 to Ryu et al. entitled "Silicon Carbide Power Metal-Oxide Semiconductor Field Effect Transistors Having A Shorting Channel And Methods Of Fabricating Silicon Carbide Metal-Oxide Semiconductor Field Effect Transistors Having A Shorting Channel." The disclosures of each of the above referenced patents is hereby incorporated herein in its entirety by reference.

By forming relatively high dopant concentration terminal contact regions 115 and well contact regions 125 using implants through epitaxial silicon carbide layer 111, improved electrical contact with ohmic contacts 117 may be provided without requiring an etch/patterning of epitaxial silicon carbide layer 111 and without adding significant processing cost/complexity. Moreover, process repeatability and/or device performance may be improved relative to structures where an epitaxial silicon carbide layer is etched/patterned to expose underlying source/drain terminal and/or well regions because undesired loss/thinning of source/drain terminal regions (e.g., due to consumption during oxidation, consumption during removal of the epitaxial layer, etc.) may be reduced/eliminated.

As discussed above, a silicon carbide DMOSFET may be provided according to some embodiments of the present invention. Highly doped terminal contact regions through epitaxial layers, however, may be used in other electronic device structures according to other embodiments of the present invention. By way of example, the structure of FIGS. 4A-C may be implemented as an insulated gate bipolar transistor (IGBT) with the addition of a collector region of layer 101 adjacent surface 105. More particularly, terminal regions 107 of the first conductivity type (e.g., n-type) may provide emitter regions of an insulated gate bipolar transistor (IGBT), and a highly doped portion of layer 101 adjacent surface 105 having the second conductivity type (e.g., p-type) may provide a collector region of the IGBT. IGBT structures are discussed by way of example in U.S. Publication No. 2008/0105949 to Zhang et al. entitled "High Power Insulated Gate Bipolar Transistors." More generally, a terminal region buried under an epitaxial semiconductor layer with a terminal contact region providing electrical contact therewith as discussed above may be implemented as a terminal region of any semiconductor electronic device. For example, a terminal region 107 may be a base, an emitter, or a collector of a bipolar junction transistor (BJT); a terminal region 107 may be an emitter or a collector of an IGBT; a terminal region 107 may be a source or a drain of a metal oxide semiconductor field effect transistor (MOSFET); a terminal region 107 may be an anode or a cathode of a diode; a terminal region 107 may be an anode, cathode, or gate of a gate turn off (GTO) thyristor; etc. The device of FIG. 4A may be implemented, for example, as an n-channel DMOSFET so that the terminal regions 107 are n-type source regions.

Moreover, while n-channel devices are discussed by way of example, other device types may be implemented according to other embodiments of the present invention. For example, p-channel devices may be provided according to other embodiments of the present invention by reversing conductivity types of the different semiconductor regions, layers, contacts, and substrates discussed above. An n-channel DMOSFET may be provided as discussed above by providing the first conductivity type as n-type so that semiconductor layer 101, source/drain terminal regions 107, source/drain terminal contact regions 115, and epitaxial layer 111 have n-type conductivity, and by providing the second conductivity type as p-type so that well regions 109 and well region contacts 125 have p-type conductivity. According to other embodiments of the present invention, a p-channel DMOSFET may be provided as discussed above by providing the first conductivity type as p-type so that semiconductor layer 101, source/drain terminal regions 107, source/drain terminal contact regions 115, and epitaxial layer 111 have p-type conductivity, and by providing the second conductivity type as n-type so that well regions 109 and well region contacts 125 have n-type conductivity. Moreover, n-channel and p-channel IGBTs may be provided according to still other embodiments of the present invention.

While silicon carbide layers/substrates and silicon carbide epitaxial layers are discussed above by way of example, other semiconductor materials (e.g., silicon, gallium nitride, gallium arsenide, etc.) may be used according to other embodiments of the present invention. In addition, horizontal devices may be provided according to still other embodiments of the present invention by providing all terminal regions and contacts on a same surface of semiconductor layer 101.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A method of forming a semiconductor device, the method comprising:
   providing a terminal region of a first conductivity type within a semiconductor layer of the first conductivity type;
   providing a well region of a second conductivity type within the semiconductor layer wherein the well region is adjacent at least a portion of the terminal region within the semiconductor layer, wherein a depth of the well region into the semiconductor layer is greater than a depth of the terminal region into the semiconductor layer, and wherein the first and second conductivity types are different;
   providing an epitaxial semiconductor layer on the semiconductor layer, wherein the epitaxial semiconductor layer has opposing first and second surfaces, wherein the first surface is adjacent the semiconductor layer, and wherein the second surface is remote from the semiconductor layer so that the first surface is between the second surface and the semiconductor layer;
   providing a terminal contact region of the first conductivity type in the epitaxial semiconductor layer, wherein the terminal contact region provides electrical contact with the terminal region; and
   providing an ohmic contact on the terminal contact region;
   wherein an outer edge of the terminal contact region adjacent the second surface of the epitaxial semiconductor layer that is remote from the semiconductor layer is set back from an outer edge of the terminal region around a perimeter of the terminal region in a direction parallel to a surface of the semiconductor layer.

2. A method according to claim 1 wherein a portion of the well region between the terminal region and an outer perimeter of the well region adjacent a surface of the semiconductor layer defines a channel, the method further comprising:
   providing a gate insulating layer on the epitaxial semiconductor layer opposite the channel; and
   providing a gate electrode on the gate insulating layer opposite the channel.

3. A method according to claim 1 further comprising:
   after providing the epitaxial semiconductor layer, providing a well contact region of the second conductivity type through central portions of the terminal contact region and the terminal region wherein the well contact region provides electrical contact with the well region.

4. A method according to claim 3 wherein the ohmic contact comprises a first metal layer on the terminal contact region and on the well contact region, a second metal layer on portions of the first metal layer opposite the well contact region, and a silicon layer on a portion of the first metal layer opposite the terminal contact region surrounding the second metal layer.

5. A method according to claim 1 wherein the epitaxial semiconductor layer comprises an epitaxial silicon carbide layer.

6. A method according to claim 1 wherein the first conductivity type comprises n-type and the second conductivity type comprises p-type.

7. A method according to claim 1 wherein providing the epitaxial semiconductor layer comprises providing the epitaxial semiconductor layer having the first conductivity type at a first dopant concentration, wherein providing the terminal contact region comprises providing the terminal contact region having the first conductivity type at a second dopant concentration wherein the second dopant concentration is at least two orders of magnitude greater than the first dopant concentration.

8. A semiconductor device comprising:
a semiconductor layer having a first conductivity type;
a terminal region of the first conductivity type within the semiconductor layer;
a well region of a second conductivity type within the semiconductor layer wherein the well region is adjacent at least a portion of the terminal region within the semiconductor layer, wherein a depth of the well region into the semiconductor layer is greater than a depth of the terminal region into the semiconductor layer, and wherein the first and second conductivity types are different;
an epitaxial semiconductor layer on the semiconductor layer including the terminal region and the well region wherein the epitaxial semiconductor layer includes a terminal contact region of the first conductivity type therein, wherein the terminal contact region provides electrical contact with the terminal region, wherein the epitaxial semiconductor layer has opposing first and second surfaces, wherein the first surface is adjacent the semiconductor layer, and wherein the second surface is remote from the semiconductor layer so that the first surface is between the second surface and the semiconductor layer; and
an ohmic contact on the terminal contact region;
wherein an outer edge of the terminal contact region adjacent the second surface of the epitaxial semiconductor layer that is remote from the semiconductor layer is set back from an outer edge of the terminal region around a perimeter of the terminal region in a direction parallel to a surface of the semiconductor layer.

9. A semiconductor device according to claim 8 wherein a portion of the well region adjacent a surface of the semiconductor layer between the terminal region and an outer perimeter of the well region defines a channel, the semiconductor device further comprising:
a gate insulating layer on the epitaxial semiconductor layer opposite the channel; and
a gate electrode on the gate insulating layer opposite the channel.

10. A semiconductor device according to claim 8 further comprising:
a well contact region of the second conductivity type through central portions of the terminal contact region and the terminal region wherein the well contact region provides electrical contact with the well region.

11. A semiconductor device according to claim 10 wherein the ohmic contact comprises a first metal layer on the terminal contact region and on the well contact region, a second metal layer on a portion of the first metal layer opposite the well contact region, and a silicon layer on a portion of the first metal layer opposite the terminal contact region surrounding the second metal layer.

12. A semiconductor device according to claim 8 wherein the epitaxial semiconductor layer comprises an epitaxial silicon carbide layer.

13. A semiconductor device according to claim 8 wherein the first conductivity type comprises n-type and the second conductivity type comprises p-type.

14. A semiconductor device according to claim 8 wherein a portion of the epitaxial semiconductor layer outside the well region has the first conductivity type at a first dopant concentration, wherein the terminal contact region has the first conductivity type at a second dopant concentration wherein the second dopant concentration is at least two orders of magnitude greater than the first dopant concentration.

15. A method of forming a semiconductor device, the method comprising:
providing a terminal region of a first conductivity type within a semiconductor layer of the first conductivity type;
providing a well region of a second conductivity type within the semiconductor layer wherein the well region is adjacent at least portions of the terminal region within the semiconductor layer, wherein a depth of the well region into the semiconductor layer is greater than a depth of the terminal region into the semiconductor layer, and wherein the first and second conductivity types are different;
providing an epitaxial semiconductor layer on the semiconductor layer including the terminal region and the well region wherein the epitaxial semiconductor layer includes a terminal contact region of the first conductivity type therein, wherein the terminal contact region provides electrical contact with the terminal region, wherein the epitaxial semiconductor layer has opposing first and second surfaces, wherein the first surface is adjacent the semiconductor layer, and wherein the second surface is remote from the semiconductor layer so that the first surface is between the second surface and the semiconductor layer; and
providing an ohmic contact on the terminal contact region;
wherein an outer edge of the terminal contact region adjacent the second surface of the epitaxial semiconductor layer that is remote from the semiconductor layer is set back from an outer edge of the terminal region around a perimeter of the terminal region in a direction parallel to a surface of the semiconductor layer.

16. A method according to claim 15 wherein a portion of the well region adjacent a surface of the semiconductor layer between the terminal region and an outer perimeter of the well region defines a channel, the method further comprising:
providing a gate insulating layer on the epitaxial semiconductor layer opposite the channel; and
providing a gate electrode on the gate insulating layer opposite the channel.

17. A method according to claim 15 wherein the ohmic contact comprises a metal layer on the terminal contact region.

18. A method according to claim 15 further comprising:
providing a well contact region of the second conductivity type through central portions of the terminal contact region and the terminal region wherein the well contact region provides electrical contact with the well region.

19. A method according to claim 15 wherein the epitaxial semiconductor layer comprises an epitaxial silicon carbide layer.

20. A method of forming a semiconductor device, the method comprising:
providing a semiconductor layer of a first conductivity type, wherein the semiconductor layer includes a terminal region of a first conductivity type within the semiconductor layer and a well region of a second conductivity type within the semiconductor layer wherein the well region is adjacent at least a portion of the terminal region within the semiconductor layer, wherein a depth of the well region into the semiconductor layer is greater than a depth of the terminal region into the semiconductor layer, and wherein the first and second conductivity types are different;
providing an epitaxial semiconductor layer on the semiconductor layer, wherein the epitaxial semiconductor layer has opposing first and second surfaces, wherein the first surface is adjacent the semiconductor layer, and wherein the second surface is remote from the semiconductor layer so that the first surface is between the second surface and the semiconductor layer;
providing a terminal contact region of the first conductivity type through the epitaxial semiconductor layer, wherein the terminal contact region provides electrical contact with the terminal region; and
providing an ohmic contact on the terminal contact region;
wherein an outer edge of the terminal contact region adjacent the second surface of the epitaxial semiconductor layer that is remote from the semiconductor layer is set back from an outer edge of the terminal region around a perimeter of the terminal region in a direction parallel to a surface of the semiconductor layer.

21. A method according to claim 20 wherein a portion of the well region between the terminal region and an outer perimeter of the well region adjacent a surface of the semiconductor layer defines a channel, the method further comprising:
providing a gate insulating layer on the epitaxial semiconductor layer opposite the channel; and
providing a gate electrode on the gate insulating layer opposite the channel.

22. A method according to claim 20 wherein the epitaxial semiconductor layer comprises an epitaxial silicon carbide layer.

23. A method according to claim 20 wherein providing the epitaxial semiconductor layer comprises providing the epitaxial semiconductor layer having the first conductivity type at a first dopant concentration, wherein providing the terminal contact region comprises providing the terminal contact region having the first conductivity type at a second dopant concentration wherein the second dopant concentration is at least two orders of magnitude greater than the first dopant concentration.

24. A semiconductor device according to claim 8 wherein a dopant concentration of the terminal contact region is at least two orders of magnitude greater than a dopant concentration of the terminal region.

25. A semiconductor device according to claim 24 wherein the terminal region comprises a first dopant element, wherein the terminal contact region comprises a second dopant element, and wherein the first and second dopant elements are different.

26. A semiconductor device according to claim 8 wherein the outer edge of the terminal contact region adjacent the second surface of the epitaxial semiconductor layer that is remote from the semiconductor layer is set back by at least about 0.1 micrometers from the outer edge of the terminal region around the perimeter of the terminal region in the direction parallel to the surface of the semiconductor layer.

27. A method according to claim 1 wherein providing the epitaxial semiconductor layer comprises providing the epitaxial semiconductor layer after providing the terminal region, and wherein providing the terminal contact region comprises providing the terminal contact region through the epitaxial semiconductor layer after providing the epitaxial semiconductor layer.

28. A method according to claim 15 wherein providing the epitaxial semiconductor layer including the terminal contact region comprises providing the epitaxial semiconductor layer including the terminal contact region after providing the terminal region.

29. A method according to claim 20 wherein providing the epitaxial semiconductor layer comprises providing the epitaxial semiconductor layer after providing the semiconductor layer including the terminal region, and wherein providing the terminal contact region comprises providing the terminal contact region after providing the epitaxial semiconductor layer.

30. A method according to claim 18 wherein the ohmic contact comprises a first metal layer on the terminal contact region and on the well contact region, a second metal layer on a portion of the first metal layer opposite the well contact region, and a silicon layer on a portion of the first metal layer opposite the terminal contact region surrounding the second metal layer.

31. A method according to claim 20 further comprising:
providing a well contact region of the second conductivity type through central portions of the terminal contact region and the terminal region wherein the well contact region provides electrical contact with the well region,
wherein the ohmic contact comprises a first metal layer on the terminal contact region and on the well contact region, a second metal layer on a portion of the first metal layer opposite the well contact region, and a silicon layer on a portion of the first metal layer opposite the terminal contact region surrounding the second metal layer.

32. A semiconductor device comprising:
a semiconductor layer having a first conductivity type;
a terminal region of the first conductivity type within the semiconductor layer;
a well region of a second conductivity type within the semiconductor layer wherein the well region is adjacent at least a portion of the terminal region within the semiconductor layer, and wherein a depth of the well region into the semiconductor layer is greater than a depth of the terminal region into the semiconductor layer;
an epitaxial semiconductor layer on the semiconductor layer including the terminal region and the well region wherein the epitaxial semiconductor layer includes a terminal contact region of the first conductivity type therein, wherein the terminal contact region provides electrical contact with the terminal region, and wherein the terminal contact region has a higher conductivity than the terminal region; and
an ohmic contact on the terminal contact region.

33. A semiconductor device according to claim 32, wherein the epitaxial semiconductor layer has opposing first and second surfaces, wherein the first surface is adjacent the semiconductor layer, wherein the second surface is remote from the semiconductor layer so that the first surface is between the second surface and the semiconductor layer, and wherein an outer edge of the terminal contact region adjacent the second surface of the epitaxial semiconductor layer that is remote from the semiconductor layer is set back from an outer edge of the terminal region around a perimeter of the terminal region in a direction parallel to a surface of the semiconductor layer.

34. A semiconductor device comprising:
a semiconductor layer having a first conductivity type;
a terminal region of the first conductivity type within the semiconductor layer;
a well region of a second conductivity type within the semiconductor layer wherein the well region is adjacent at least a portion of the terminal region within the semiconductor layer, and wherein a depth of the well region into the semiconductor layer is greater than a depth of the terminal region into the semiconductor layer;
an epitaxial semiconductor layer on the semiconductor layer including the terminal region and the well region wherein the epitaxial semiconductor layer includes a terminal contact region of the first conductivity type therein, wherein the terminal contact region provides electrical contact with the terminal region, and wherein a dopant concentration of the terminal contact region is at least two orders of magnitude greater than a dopant concentration of the terminal region; and
an ohmic contact on the terminal contact region.

35. A semiconductor device comprising:
a semiconductor layer having a first conductivity type;
a terminal region of the first conductivity type within the semiconductor layer;
a well region of a second conductivity type within the semiconductor layer wherein the well region is adjacent at least a portion of the terminal region within the semiconductor layer;
an epitaxial semiconductor layer on the semiconductor layer including the terminal region and the well region wherein the epitaxial semiconductor layer includes a differently doped terminal contact region of the first conductivity type therein, wherein the terminal contact region provides electrical contact with the terminal region, wherein the terminal region comprises a first dopant element, wherein the terminal contact region comprises a second dopant element, and wherein the first and second dopant elements are different; and
an ohmic contact on the terminal contact region.

36. A semiconductor device according to claim 32 wherein a depth of the well region into the semiconductor layer is greater than a depth of the terminal region into the semiconductor layer, and wherein the first and second conductivity types are different.

37. A semiconductor device according to claim 34 wherein a depth of the well region into the semiconductor layer is greater than a depth of the terminal region into the semiconductor layer, and wherein the first and second conductivity types are different.

38. A semiconductor device according to claim 35 wherein a depth of the well region into the semiconductor layer is greater than a depth of the terminal region into the semiconductor layer, and wherein the first and second conductivity types are different.

* * * * *